(12) United States Patent
Cho

(10) Patent No.: US 8,048,724 B2
(45) Date of Patent: Nov. 1, 2011

(54) SEMICONDUCTOR SWITCHING DEVICE

(75) Inventor: Hyun-Jin Cho, Palo Alto, CA (US)

(73) Assignee: Advanced Micro Devices, Inc., Sunnvale, CA (US)

( * ) Notice: Subject to any disclaimer, the term of this patent is extended or adjusted under 35 U.S.C. 154(b) by 0 days.

(21) Appl. No.: 12/707,519

(22) Filed: Feb. 17, 2010

(65) Prior Publication Data
US 2010/0142263 A1 Jun. 10, 2010

Related U.S. Application Data

(62) Division of application No. 11/615,983, filed on Dec. 24, 2006, now Pat. No. 7,679,955.

(60) Provisional application No. 60/835,161, filed on Aug. 2, 2006.

(51) Int. Cl.
*H01L 21/332* (2006.01)

(52) U.S. Cl. .......... 438/135; 438/234; 257/E21.696

(58) Field of Classification Search .......... 438/135, 438/234, 235, 236; 257/E21.382, E21.695
See application file for complete search history.

(56) References Cited

U.S. PATENT DOCUMENTS

| | | | |
|---|---|---|---|
| 4,199,774 A | 4/1980 | Plummer | |
| 5,119,337 A | 6/1992 | Shimizu et al. | |
| 5,345,103 A | 9/1994 | Aoki | |
| 5,459,083 A * | 10/1995 | Subrahmanyan et al. | .... 438/236 |
| 5,872,032 A | 2/1999 | Chi | |
| 5,909,400 A | 6/1999 | Bertin et al. | |
| 5,998,820 A | 12/1999 | Chi | |
| 6,376,880 B1 | 4/2002 | Holst | |
| 6,492,211 B1 | 12/2002 | Divakaruni et al. | |
| 6,768,667 B2 | 7/2004 | Hoffmann et al. | |
| 6,791,107 B2 * | 9/2004 | Gill et al. | .......... 257/20 |
| 6,838,723 B2 | 1/2005 | Forbes | |
| 6,873,018 B2 | 3/2005 | Bhattacharyya | |
| 6,914,255 B2 | 7/2005 | Lowrey | |
| 6,943,083 B2 | 9/2005 | Forbes | |
| 6,989,580 B2 | 1/2006 | Pellizzer et al. | |
| 7,030,436 B2 | 4/2006 | Forbes | |
| 7,466,584 B1 | 12/2008 | Parkinson et al. | |
| 7,515,455 B2 | 4/2009 | Nirshl et al. | |
| 7,532,507 B2 | 5/2009 | Hayakawa | |
| 2004/0155298 A1 | 8/2004 | Bhattacharyya | |
| 2004/0155299 A1 | 8/2004 | Bhattacharyya | |
| 2009/0003044 A1 | 1/2009 | Happ et al. | |

OTHER PUBLICATIONS

Rudolf F. Graf; *Modern Dictionary of Electronics*, 7th Ed., 1999, pp. 782-783.

* cited by examiner

*Primary Examiner* — Chandra Chaudhari
(74) *Attorney, Agent, or Firm* — Timothy M. Honeycutt

(57) ABSTRACT

A switching device and methods of making and operating the same are provided. In one aspect, a method of operating a switching device is provided that includes providing a MOS transistor that has a gate, a source region, a drain region and a body region. A bipolar transistor is provided that has a collector, a base and an emitter. The body region of the MOS transistor serves as the base of the bipolar transistor and the drain region of the MOS transistor serves as the collector of the bipolar transistor. Activation of the MOS transistor causes the bipolar transistor to turn on. The MOS transistor is activated to turn on the bipolar transistor and the bipolar transistor delivers current to the source region.

14 Claims, 5 Drawing Sheets

SEMICONDUCTOR SWITCHING DEVICE

This application is a divisional of prior application Ser. No. 11/615,983, filed Dec. 24, 2006 now U.S. Pat. No. 7,679,955, which claims benefit under 35 U.S.C. 119(e) of prior provisional application Ser. No. 60/835,161, filed Aug. 2, 2006.

BACKGROUND OF THE INVENTION

1. Field of the Invention

This invention relates generally to semiconductor devices and more particularly to a switch that has fast switching speed and high current capability.

2. Description of the Related Art

The metal-oxide-semiconductor field effect transistor (MOSFET) is the most widely used switching device in very large scale integration (VLSI) circuitry. Its popularity derives from its simple structure and low fabrication cost. The bipolar junction transistor (BJT) is another semiconductor device. The BJT is widely used in high power and high speed products. A MOSFET is typically turned on by applying a voltage to a gate to create a field effect channel, while a BJT typically is turned on by forward biasing a PN junction which renders the device conductive.

In some applications, it is desirable to have a device that is simple to fabricate and can conduct high current. Examples of such devices are: (1) a lateral double-diffused transistor (LDMOS), (2) a vertical double-diffused transistor (VDMOS), and (3) a V-groove double-diffused transistor. However, the fabrication of these devices is based on BJT processing. Thus, it is difficult to adopt these devices in conventional low-cost CMOS processes. As a result, they are not widely used in VLSI.

The present invention is directed to overcoming or reducing the effects of one or more of the foregoing disadvantages.

SUMMARY OF THE INVENTION

An embodiment of the present invention relates to a device that combines a MOSFET and a BJT. The MOSFET comprises a source, a drain, and a body region. After the MOSFET is turned on, the resulting field effect channel allows the electrons to flow from one node (e.g., the source) to another node (e.g., the drain). The movement of the electrons causes a large number of holes to be generated in the body through a mechanism called impact-ionization. The body region of the MOSFET forms the base of the BJT. The holes raise the potential of the base. When a threshold base-emitter voltage of the BJT is reached, the BJT is turned on. It can then conduct a large amount of current.

Device fabrication is compatible with bulk CMOS process. The device can be easily scaled down to sub-50 nm dimensions. As a result, the device is simple to fabricate and can handle high power.

In accordance with one aspect of the present invention, a method of operating a switching device is provided that includes providing a MOS transistor that has a gate, a source region, a drain region and a body region. A bipolar transistor is provided that has a collector, a base and an emitter. The body region of the MOS transistor serves as the base of the bipolar transistor and the drain region of the MOS transistor serves as the collector of the bipolar transistor. Activation of the MOS transistor causes the bipolar transistor to turn on. The MOS transistor is activated to turn on the bipolar transistor and the bipolar transistor delivers current to the source region.

In accordance with another aspect of the present invention, a method of fabricating a device is provided. A MOS transistor is formed that has a gate, a source region, a drain region and a body region. A bipolar transistor is formed that has a collector, a base and an emitter. The body region of the MOS transistor is formed to serve as the base of the bipolar transistor and the drain region of the MOS transistor is formed to serve as the collector of the bipolar transistor.

In accordance with another aspect of the present invention, a switching device is provided that includes a MOS transistor that has a gate, a source region, a drain region and a body region. A bipolar transistor is provided that includes a collector, a base and an emitter. The body region of the MOS transistor servers as the base of the bipolar transistor and the drain region of the MOS transistor serves as the collector of the bipolar transistor. Activation of the MOS transistor causes the bipolar transistor to turn on.

In accordance with another aspect of the present invention, a storage cell is provided that includes a MOS transistor that has a gate, a source region, a drain region and a body region. A bipolar transistor is provided that has a collector, a base and an emitter. A storage structure is electrically coupled to the drain region. The body region of the MOS transistor servers as the base of the bipolar transistor and the drain region of the MOS transistor serves as the collector of the bipolar transistor such that activation of the MOS transistor causes the bipolar transistor to turn on.

DETAILED DESCRIPTION OF SPECIFIC EMBODIMENTS

The following description is presented to enable any person skilled in the art to make and use the invention. Descriptions of specific applications are provided only as examples. Various modifications to the disclosed embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
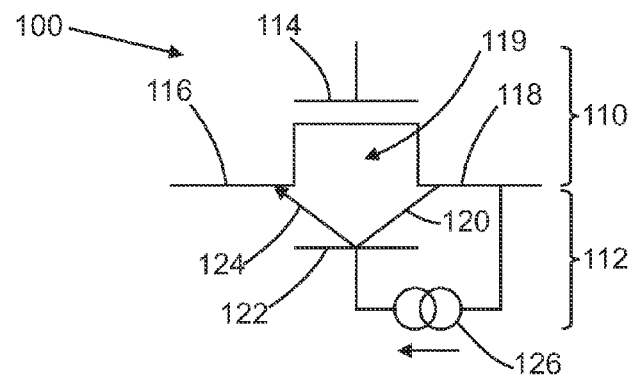
FIG. 1 is a schematic view of an exemplary embodiment of a switching device in accordance with the present invention.

Turning now to the drawings, and in particular to FIG. 1, therein is shown a schematic view of an exemplary embodiment of a switching device 100. The device 100 includes a MOS transistor and a BJT 112 adjacent to each other. The MOS transistor 110 may implemented as a MOSFET. The MOSFET may include a gate 114, a source 116, a drain 118 and a body 119. The skilled artisan will appreciate that the functions of the source 116 and the drain 118 can be interchanged depending upon how they are biased. Thus, references to "source" or "drain" herein should be understood to refer to an impurity region that could function as either.

The BJT 112 includes a collector 120, a base 122 and an emitter 124. The device 100 is designed to deliver higher currents than might be possible using conventional MOSFET devices. Accordingly, and as described in more detail below: (1) the drain node 118 of the MOSFET 110 doubles as the collector node 120 of the BJT 112; (2) the source node 116 of the MOSFET 110 doubles as the emitter node 124 of the BJT 112; and (3) the body 119 of the MOSFET 110 doubles as the base node 122 of the BJT 112. A current source 126, driven by impact ionization as described in detail below, can turn on the base 122 of the BJT 112. Once the base 122 is turned on, a substantial amount of current can flow through the device 100.

Figure 2:
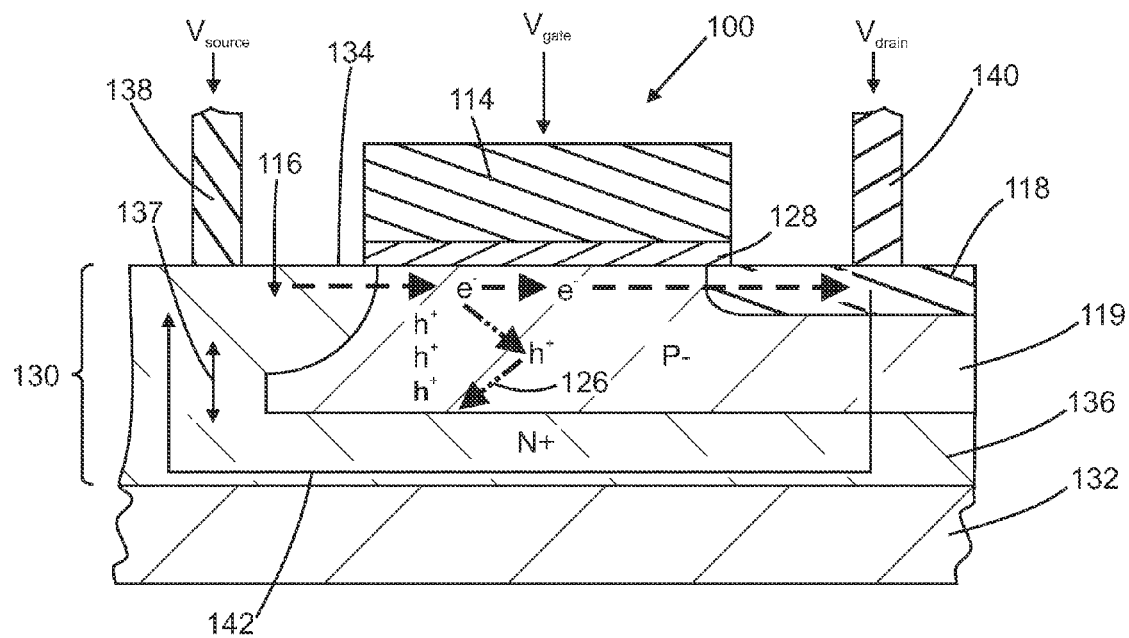
FIG. 2 is a sectional of an exemplary embodiment of a switching device in accordance with the present invention.

A sectional view of an exemplary physical implementation of the exemplary embodiment of the switching device 100 is depicted in FIG. 2. The device 100 includes the gate 114, the impurity region or source 116, the impurity region or drain 118 and the body 119. The gate 114 and an underlying gate dielectric layer 128 are stacked and positioned on a semiconductor layer 130. The semiconductor layer 130 is, in-turn, positioned on a supporting substrate 132. The source 116 and the drain 118 are implemented as two N+ diffused impurity regions formed below a surface 134 of the semiconductor layer 130 at opposite sides of the gate 114. The semiconductor layer 130 includes a N+ impurity region or body 136 and the P-type impurity region or body 119 that is formed in the N+ body 136. The substrate 132 is preferably of P-type. The source 116 is electrically coupled to the body region 136 by establishing impurities of the same conductivity type as both the body region 136 and the source 116 in the transition region 137 the body 136 region and the source 116. In this example, n-type impurities are used to establish the electrical connection. Conducting contact structures 138 and 140 may be formed on the impurity region 116 and the impurity region 118 respectively. Voltages $V_{source}$, $V_{gate}$ and $V_{drain}$ may be applied to the source 116, gate 114 and drain 118, respectively.

The impurity region 116, the gate 114, the impurity region 118 and the impurity region or body 119 serve, respectively, as the source, gate, drain and body of a MOSFET. The impurity region 118, the impurity region 119 and the N+ body 136 serve, respectively, as the collector, base and emitter of a BJT. Thus, the impurity region 118 serves double duty as a MOSFET drain and a BJT collector, and the impurity region 119 serves double duty as the MOSFET body and BJT base.

Electrons e⁻ and holes h⁺ are shown to illustrate the operation of the device 100. In one embodiment, positive voltages are applied to the gate 114 and the impurity region 118 while the impurity region 116 and the N+ body 136 are tied to ground. A channel is formed in the impurity region 119 underneath the gate 114 between the impurity region 116 and the impurity region 118. Electrons e⁻ are able to move from the impurity region 116 to the impurity region 118. As a result of impact ionization (represented by the element number 126), electron-hole h⁺ pairs are formed that pile up inside the impurity region 119. The holes h⁺ raise the potential of the impurity region 119 while the potential of the N+ region 136 remains at ground. When the potential between the impurity region 119 and the N+ body 136 rises above a threshold value, the junction between these two bodies becomes a forward biased diode and bipolar action kicks in. Current from the impurity region or drain 118 can now flow to the impurity region or source 116 through the impurity region 119 and the N+ impurity region 136 shown by the current path 142. Because the path 142 has a large area compared to that of the channel between the impurity regions 116 and 118, a substantial amount of current can be conducted.

Figure 3:
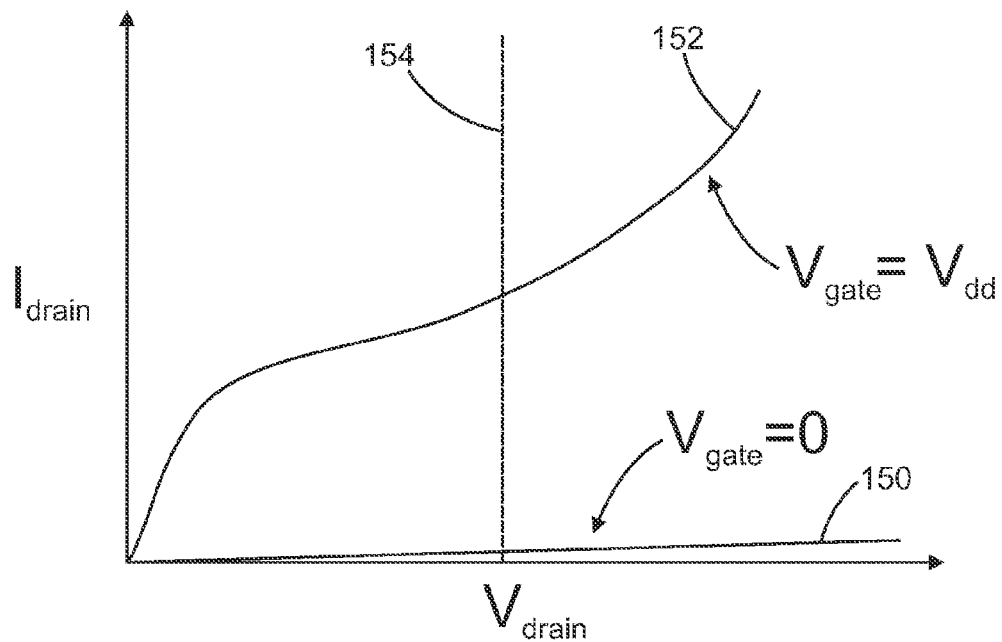
FIG. 3 is a plot of current versus voltage for an exemplary embodiment of a switching device in accordance with the present invention.

FIG. 3 shows I-V curves of the device 100 of the present invention. It will be useful to consider FIG. 3 in conjunction with FIGS. 1 and 2. The I-V curve 150 shows the characteristics of the device 100 when the potential of gate $V_{gate}$ is zero. The drain current $I_{drain}$ remains very low even when the drain voltage $V_{drain}$ increases. This is because no channel is formed underneath the gate 114 (see FIG. 2) and resistance of the MOSFET 110 (see FIG. 1) is high. Typically, the drain current $I_{drain}$ is at or below the pico ampere level.

The I-V curve 152 shows the characteristics of the device 100 when the potential $V_{gate}$ at the gate 114 (see FIG. 2) is the same as supply voltage $V_{dd}$, typically 1.0V to 3.0V. An inversion channel is formed between the source and drain, and current begins to flow from the drain to the source. When the drain voltage $V_{drain}$ increases from zero to a trigger voltage 154, the drain current $I_{drain}$ increases sharply initially, then plateaus out. In this bias condition, a device current path is defined by the surface of the MOSFET 110. Thus, the behavior of the portion of I-V curve 152 to the left of the trigger voltage 154 is dominated by the characteristics of a MOS device. When the drain voltage $V_{drain}$ increases past the trigger voltage 154, channel electrons e⁻ gain far more kinetic energy and produce electron and hole h⁺ pairs due to the high electric field from gate and drain and resulting impact ionization. Holes h⁺ created by impact ionization are piled up at the P-body 119 and raise potential thereof. When the local forward bias voltage between the P-body 119 and the N+ body 136 approaches a threshold voltage (e.g., about 0.6V), electrons e⁻ from the N+ body 136 can be injected into the P+ body 119, which triggers BJT action. Now the current conduction mechanism is dominated by BJT action, as shown in the portion of the I-V curve 152 to the right of the trigger voltage 154. As a result, the current passing through device 100 rises sharply.

Exemplary fabrication processes for the switching device disclosed herein will now be described. At least two types of process flows can be used. In the first type, device fabrication starts from a conventional bulk silicon wafer. A highly doped N-type epitaxial layer is grown on a substrate. A P-type layer is then grown by an additional epitaxial process. The gate dielectric, gate and source/drain implantation are formed using conventional CMOS processing. An N-type implant at the source side is applied to create a source to N-body connection at the transition region of the type numbered 137 and shown in FIG. 2. Finally, a rapid thermal anneal is performed to activate the implanted dopants.

In a second exemplary process flow, a retrograded N-well process is used. The N-body is formed using high energy and high dose implantation prior to conventional transistor formation. The rest of process is similar to the first type of process flow.

Figure 4:
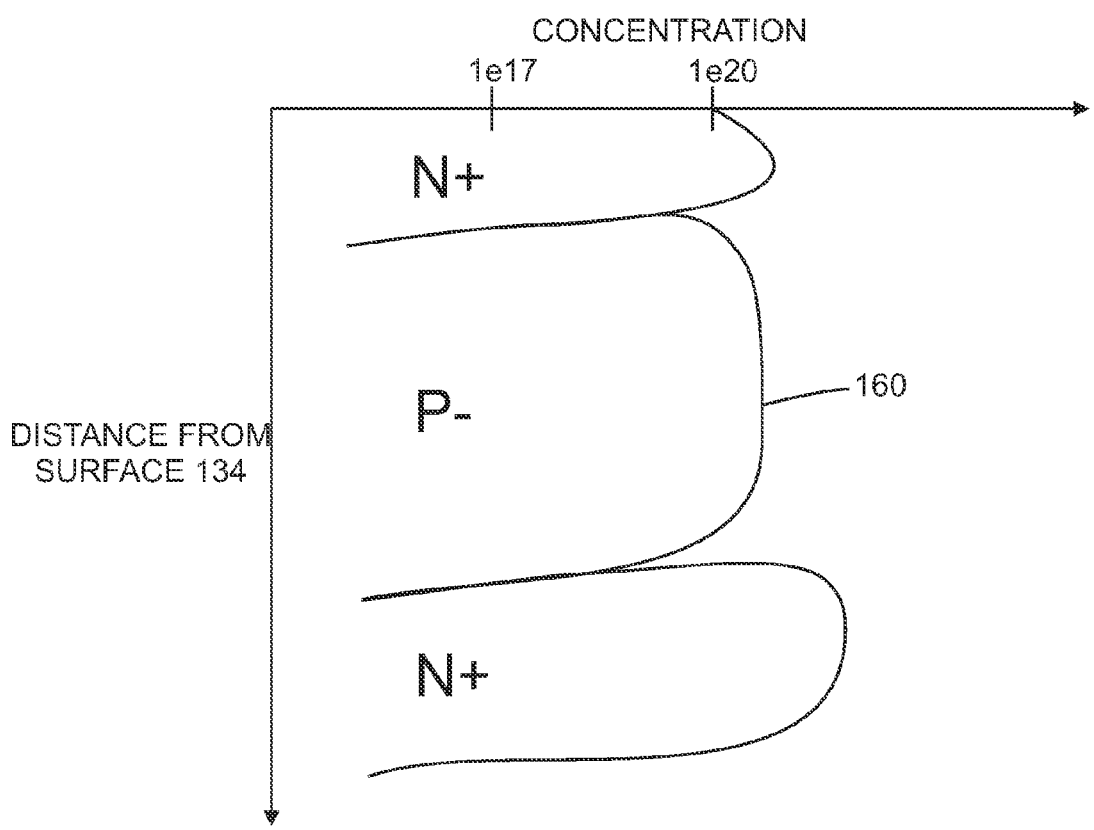
FIG. 4 is an impurity profile of an exemplary embodiment of a switching device in accordance with the present invention.

An exemplary doping profile for the device 100 is depicted in FIGS. 1 and 2 is shown in FIG. 4, and should be observed in conjunction with FIG. 2. The doping profile 160 is in the vertical direction. The vertical axis of FIG. 4 is the distance from the top surface 134 down through the drain 118, the body 119 and the N+ body 136. In this embodiment, the maximum doping in the body 119 under gate 114 determines the MOSFET threshold voltage. The maximum doping in the body 119 under the drain 118 determines the BJT gain. The distance between the source 116 and the drain 118 limits the MOSFET short channel effect and the distance between the drain 118 to the N+ body 136 (e.g., 100 to 500 nm) determines the BJT gain. The doping concentration of the N+ region 136 can also affect BJT gain.

Figure 5:
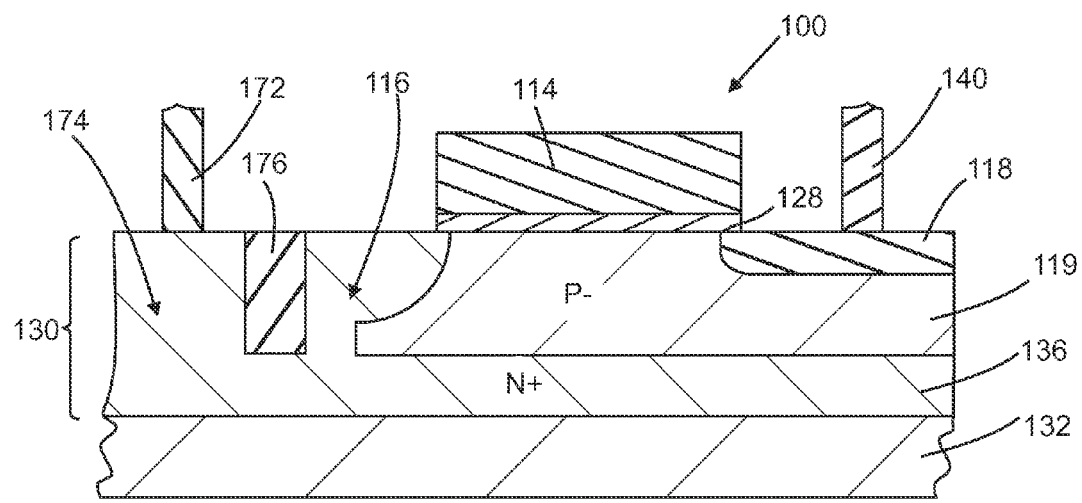
FIG. 5 is a sectional view of an alternate exemplary embodiment of a switching device in accordance with the present invention.

An alternate exemplary embodiment of the switching device 100' is depiction in section in FIG. 5. Like the device 100 depicted in FIG. 2, the device 100' includes the gate 114, the impurity region or source 116, the impurity region or drain 118 and the body 119. The gate 114 and an underlying gate dielectric layer 128 are stacked and positioned on a semiconductor layer 130. The semiconductor layer 130 is, in-turn, positioned on a supporting substrate 132. The source 116 and the drain 118 are implemented as two N+ diffused impurity regions formed below a surface 134 of the semiconductor layer 130 at opposite sides of the gate 114. The semiconductor layer 130 includes a N+ impurity region or body 136 and the P-type impurity region or body 119 that is formed in the N+ body 136. The substrate 132 is preferably of P-type.

Conducting contact structure 140 may be formed on the impurity region 118.

However, unlike the device 100, there is no top contact connected to the source region 116. Instead, a contact 172 is coupled to a common region 174 that extends from the N+ region 136 of the device 100'. The common region 174 is separated from the source region 116 using an isolation structure 176. The isolation structure may be trench isolation, field oxide or the like. In this embodiment, carriers collected by the sources of all devices to the right of the common region 170, including the source 116 of the device 100', can be removed through the top contact 174 through the highly conductive N+ region 136. One advantage of this arrangement is that the number of top contacts and the size of the device can be reduced.

The switching device disclosed herein can be used in a variety of semiconductor products. One application of the device is in supplying current to a phase change memory (also known as PRAM). A PRAM is a type of nonvolatile memory. The storage material can be structurally altered between a crystalline state and an amorphous state by the application of heat. The crystalline and amorphous states each have dramatically different electric resistivity. In one embodiment, the high resistance amorphous state also known as the "RESET" state is used to represent a binary "1", and the low resistance crystalline state also known as the "SET" state is used to represent a binary "0". The heat to change the resistance state of the phase change material is generated by electrical current. As a result, PRAM requires high current conduction, especially for the RESET operation, which needs high current to produce enough heat to transfer the phase change material from a crystalline to an amorphous phase.

Figure 6:
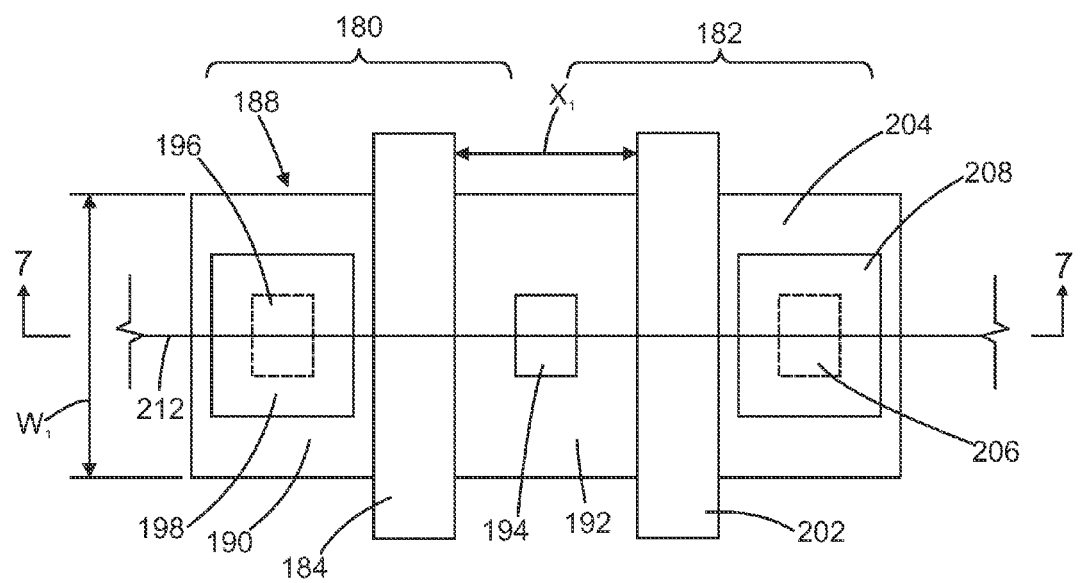
FIG. 6 is a layout view of an exemplary conventional pair of phase change random access memory (PRAM) cells.
Figure 7:
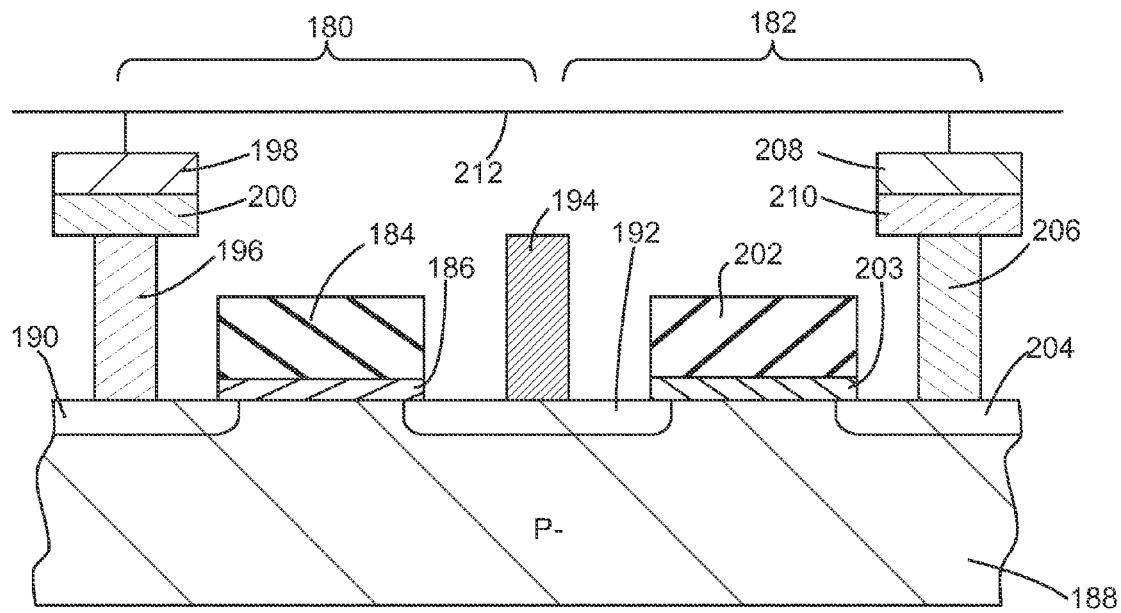
FIG. 7 is a sectional view of FIG. 6 taken at section 7-7.

Two conventional PRAM cells 180 and 182 are depicted in FIGS. 6 and 7. FIG. 6 is a layout (essentially a top view) and FIG. 7 is a sectional view of FIG. 6 taken at section 6-6. It may be useful to refer to both FIGS. 6 and 7. The cell 180 includes a wordline 184 and gate dielectric 186 stack positioned on a P-substrate 188. The wordline 184 is straddled by two impurity regions 190 and 192. A ground contact 194 is coupled to the impurity region 192. A contact 196 is coupled to the impurity region 190. An interconnect plate 198 is positioned over the contact 196. A phase change material 200 (not visible in FIG. 6) is coupled to the contact 196 from below and to the plate 198 from above. The cell 182 is like a mirror image of the cell 180. In this regard, the cell 182 includes a wordline 202 and a gate dielectric 203 stack positioned on the substrate 188. The wordline 202 is straddled by an impurity region 204 and the impurity region 192 shared with the cell 180. The ground contact 194 is thus common to the cells 180 and 182. A contact 206 is coupled to the impurity region 204. An interconnect plate 208 is positioned over the contact 206. A phase change material 210 (not visible in FIG. 6) is coupled to the contact 206 from below and to the plate 208 from above. A bit line 212 is coupled to the phase change materials 200 and 210.

The conventional cells 180 and 182 are hampered by two space limitations that are depicted in FIG. 6. First, and because of the need to have the common ground contact 194, the separation distance $X_1$ between the cells 180 and 182 is large. Second, flowing high current using conventional MOSFETs is difficult without increasing the transistor width $W_1$.

Figure 8:
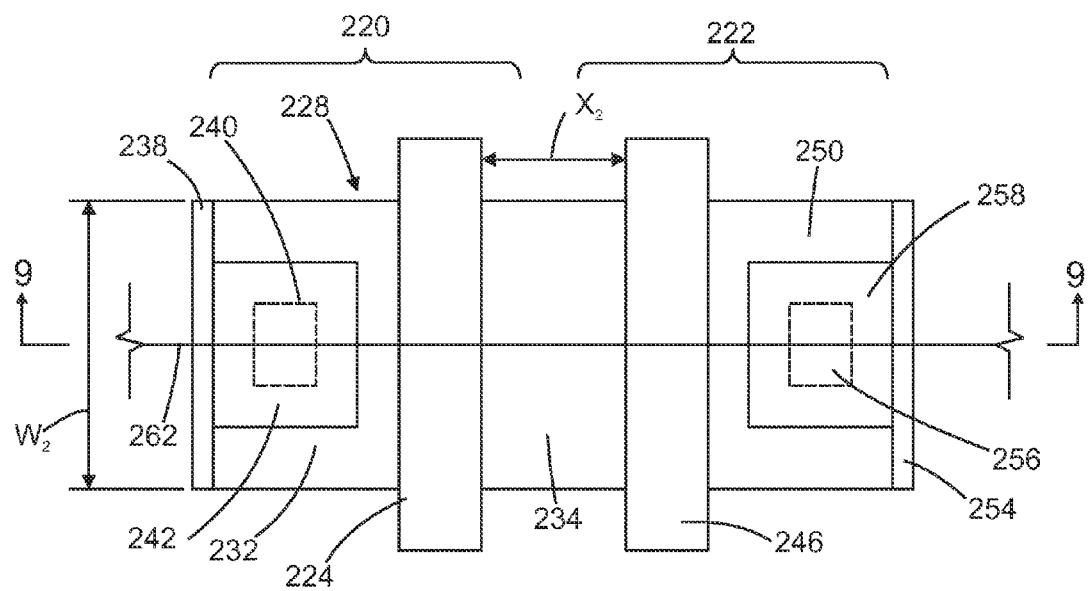
FIG. 8 is a layout view of an exemplary embodiment of a pair of phase change random access memory (PRAM) cells in accordance with the present invention.
Figure 9:
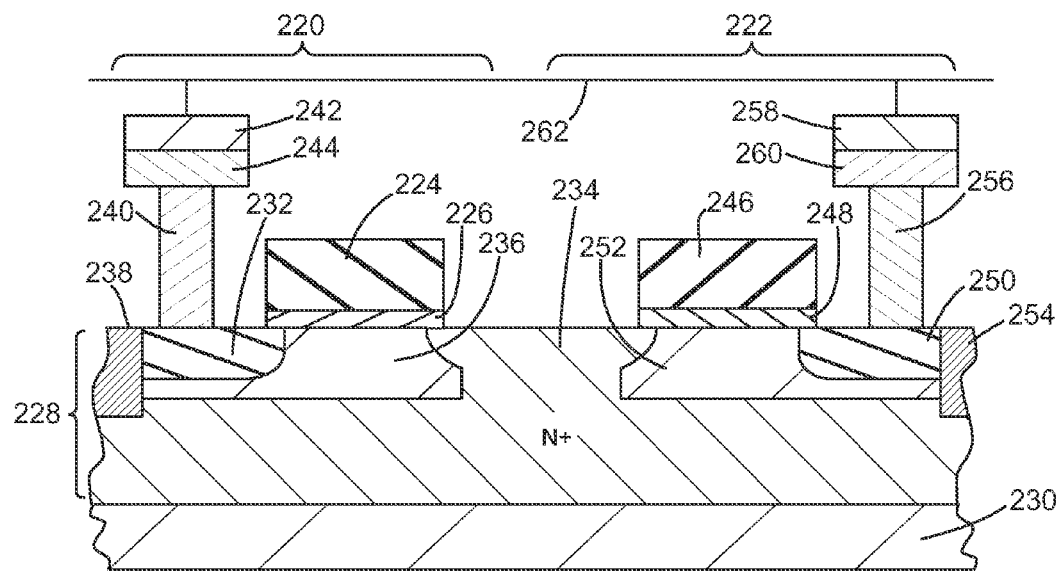
FIG. 9 is a sectional view of FIG. 8 taken at section 9-9.

An exemplary embodiment of two PRAM cells 220 and 222 in accordance with the present invention are depicted in FIGS. 8 and 9. FIG. 8 is a layout (essentially a top view) and FIG. 9 is a sectional view of FIG. 8 taken at section 9-9. For the present discussion, it may be useful to refer to both FIGS. 8 and 9. The cell 220 includes a wordline 224 and a gate dielectric 226 stack positioned on a semiconductor layer 228. The semiconductor layer 228 is positioned on a supporting substrate 230. The wordline 224 is straddled by two impurity regions 232 and 234. Though not visible in FIG. 8, the impurity region is positioned in another impurity region 236 that is in the semiconductor layer 228. Both the impurity regions 232 and 236 are bordered laterally by an isolation structure 238. The impurity region 234 is part of a larger doped portion of the semiconductor layer 228. A contact 240 is coupled to the impurity region 232. An interconnect plate 242 is positioned over the contact 240. A phase change material 244 (not visible in FIG. 8) is coupled to the contact 240 from below and to the plate 242 from above. A variety of phase change materials may be used. In one example, the phase change material may be a combination of barium, strontium, titanium and oxygen with the formula: $Ba_xSr_{1-x}TiO_3$.

The cell 222 is like a mirror image of the cell 220. In this regard, the cell 222 includes a wordline 246 and a gate dielectric 248 stack positioned on the semiconductor layer 228. The wordline 246 is straddled by an impurity region 250 and the impurity region 234 shared with the cell 220. Though not visible in FIG. 8, the impurity region 250 is positioned in another impurity region 252 that is in the semiconductor layer 228. Both the impurity regions 250 and 252 are bordered laterally by an isolation structure 254. A contact 256 is coupled to the impurity region 250. An interconnect plate 258 is positioned over the contact 256. A phase change material 260 (not visible in FIG. 8) is coupled to the contact 256 from below and to the plate 258 from above. A bit line 262 is coupled to the phase change materials 244 and 260. The skilled artisan will appreciate that the cell 222 is configured and operates much like the switching device 100 depicted in FIG. 2.

Note that there is no contact between the word lines 224 and 246 of the cells 220 and 222. As a result, the cell separation $X_2$ in FIG. 8 is smaller than that of the conventional PRAM cells 180 and 182 depicted in FIG. 6. Furthermore, the cell width $W_2$ can be smaller than that in FIG. 6 because of the ability of the device, e.g., 100 or 100', to deliver high current.

Figure 10:
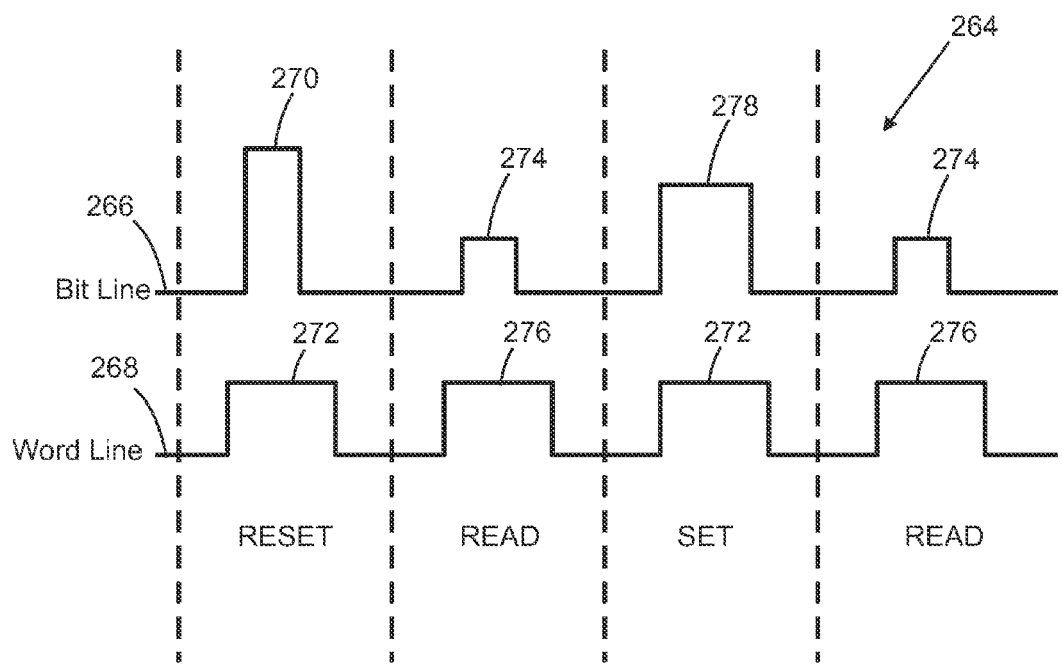
FIG. 10 is a timing diagram depicting the operation of a PRAM cell, such as one of the PRAM cells shown in FIGS. 8 and 9 in accordance with the present invention.

A timing diagram 264 of the operation of a PRAM cell, such as the PRAM cell 220, is shown in FIG. 10. At standby, the bit line is at a standby voltage 266, which is preferably ground, and the word line is also at standby voltage 268, which can be ground or negative voltage. For the RESET operation, the word line is raised to a first bias voltage 270 of between 1.0V and 3.0V and a voltage 272 of between 1.0V and 5.0V is applied to the bit line. In this bias condition, the BJT component of the switching device is activated and a large amount of current can flow. After the RESET is completed, the bit line voltage is returned to standby voltage 266, followed by the word line also returning to standby voltage 268. During the READ operation the word line is raised to a second bias voltage 274 of between 1.0V and 3.0V and a bias voltage 276 of between 0.5V to 1.5V is applied to the bit line. The state of the memory ("0" or "1") is determined by measuring the current through the bit line. A low current means that the cell is in a high resistive state, and the memory cell can be considered in a "1" state. A high current means that the cell is in a low resistive state, and the memory cell can be considered in a "0" state.

In the SET condition, the bias voltage applied to the word line is substantially the same as the bias voltage 272 and a bias voltage 278 is applied to the bit line. Bias voltage 278 can be the same as or lower than voltage 270. Note that the width of the bit line bias voltage 278 pulse in the SET condition is wider than that of the RESET condition 272. This condition is designed such that the current level is not high enough to change the phase change material to amorphous state and high enough to change the material to crystalline state. A READ after the SET condition is similar to the above-described READ after the RESET condition.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a device, comprising:
    forming a MOS transistor having a gate, a source region, a drain region and a body region;
    forming a bipolar transistor having a collector, a base and an emitter;
    wherein the body region of the MOS transistor is formed to serve as the base of the bipolar transistor and the drain region of the MOS transistor is formed to serve as the collector of the bipolar transistor; and
    forming a storage structure in electrical contact with the drain region.

2. The method of claim 1, wherein the source of the MOS transistor is formed to be electrically coupled to the emitter of the bipolar transistor and the base is formed to float.

3. The method of claim 1, wherein the emitter, body region and base are formed by doped epitaxial growth and the source region and drain region are formed by ion implantation.

4. The method of claim 1, wherein the emitter, source region and drain region are formed by ion implantation and the base is formed by doped epitaxial growth.

5. The method of claim 1, wherein the storage structure comprises a phase change material.

6. The method of claim 5, comprising forming a contact between the storage structure and the drain region.

7. The method claim 5, comprising forming a bit line in electrical contact with the storage structure.

8. A method of fabricating a device, comprising:
    forming a MOS transistor having a gate, an n-type impurity source region, an n-type impurity drain region and a body region;
    forming a bipolar transistor having a collector, a p-type impurity base and an n-type impurity emitter;
    wherein the body region of the MOS transistor is formed to serve as the base of the bipolar transistor and the n-type impurity drain region of the MOS transistor is formed to serve as the collector of the bipolar transistor; and
    forming a storage structure in electrical contact with the n-type impurity drain region.

9. The method of claim 8, wherein the n-type impurity source region of the MOS transistor is formed to be electrically coupled to the n-type impurity emitter of the bipolar transistor and the p-type impurity base is formed to float.

10. The method of claim 8, wherein the n-type impurity emitter, body region and p-type impurity base are formed by doped epitaxial growth and the n-type impurity source region and n-type impurity drain region are formed by ion implantation.

11. The method of claim 8, wherein the n-type emitter, n-type impurity source region and n-type impurity drain region are formed by ion implantation and the p-type impurity base is formed by doped epitaxial growth.

12. The method of claim 1, wherein the storage structure comprises a phase change random access memory cell.

13. The method of claim 8, wherein the storage structure comprises a phase change random access memory cell.

14. A method of fabricating a device, comprising:
    forming a MOS transistor having a gate, a source region, a drain region and a body region;
    forming a bipolar transistor having a collector, a base and an emitter;
    wherein the body region of the MOS transistor is formed to serve as the base of the bipolar transistor and the drain region of the MOS transistor is formed to serve as the collector of the bipolar transistor, and the MOS transistor and the bipolar transistor include less than three junctions; and
    forming a storage structure in electrical contact with the drain region.

* * * * *